(12) United States Patent
Choi

(10) Patent No.: US 8,339,885 B2
(45) Date of Patent: Dec. 25, 2012

(54) DATA TRANSFER CIRCUIT OF SEMICONDUCTOR APPARATUS

(75) Inventor: Byeong Chan Choi, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 187 days.

(21) Appl. No.: 12/970,495

(22) Filed: Dec. 16, 2010

(65) Prior Publication Data

US 2012/0002492 A1  Jan. 5, 2012

(30) Foreign Application Priority Data

Jul. 5, 2010 (KR) .................. 10-2010-0064303

(51) Int. Cl.
*G11C 7/02* (2006.01)

(52) U.S. Cl. .................. 365/204; 365/206

(58) Field of Classification Search .......... 365/204, 365/206, 189.18
See application file for complete search history.

(56) References Cited

U.S. PATENT DOCUMENTS

| | | | |
|---|---|---|---|
| 5,517,462 A | 5/1996 | Iwamoto et al. | |
| 6,504,789 B2 | 1/2003 | Hirakawa | |
| 7,414,907 B2* | 8/2008 | Kajitani et al. | 365/207 |
| 7,830,738 B2 | 11/2010 | Kajigaya | |
| 7,990,755 B2* | 8/2011 | Kim | 365/149 |
| 2010/0238740 A1* | 9/2010 | Matsuoka et al. | 365/189.05 |

FOREIGN PATENT DOCUMENTS

| | | |
|---|---|---|
| JP | 2001-184864 | 7/2001 |
| KR | 100272208 B1 | 8/2000 |
| KR | 1020100052240 A | 5/2010 |

* cited by examiner

*Primary Examiner* — Vu Le

(74) *Attorney, Agent, or Firm* — William Park & Associates Ltd.

(57) ABSTRACT

Various embodiments of a data transfer circuit of a semiconductor apparatus are disclosed. In one exemplary embodiment, the data transfer circuit may include a first data line, a second data line, a first transfer unit configured to amplify data on the first data line in response to a first control signal and transfer amplified data to the second data line, and a second transfer unit configured to electrically connect the first data line to the second data line in response to a second control signal.

12 Claims, 4 Drawing Sheets

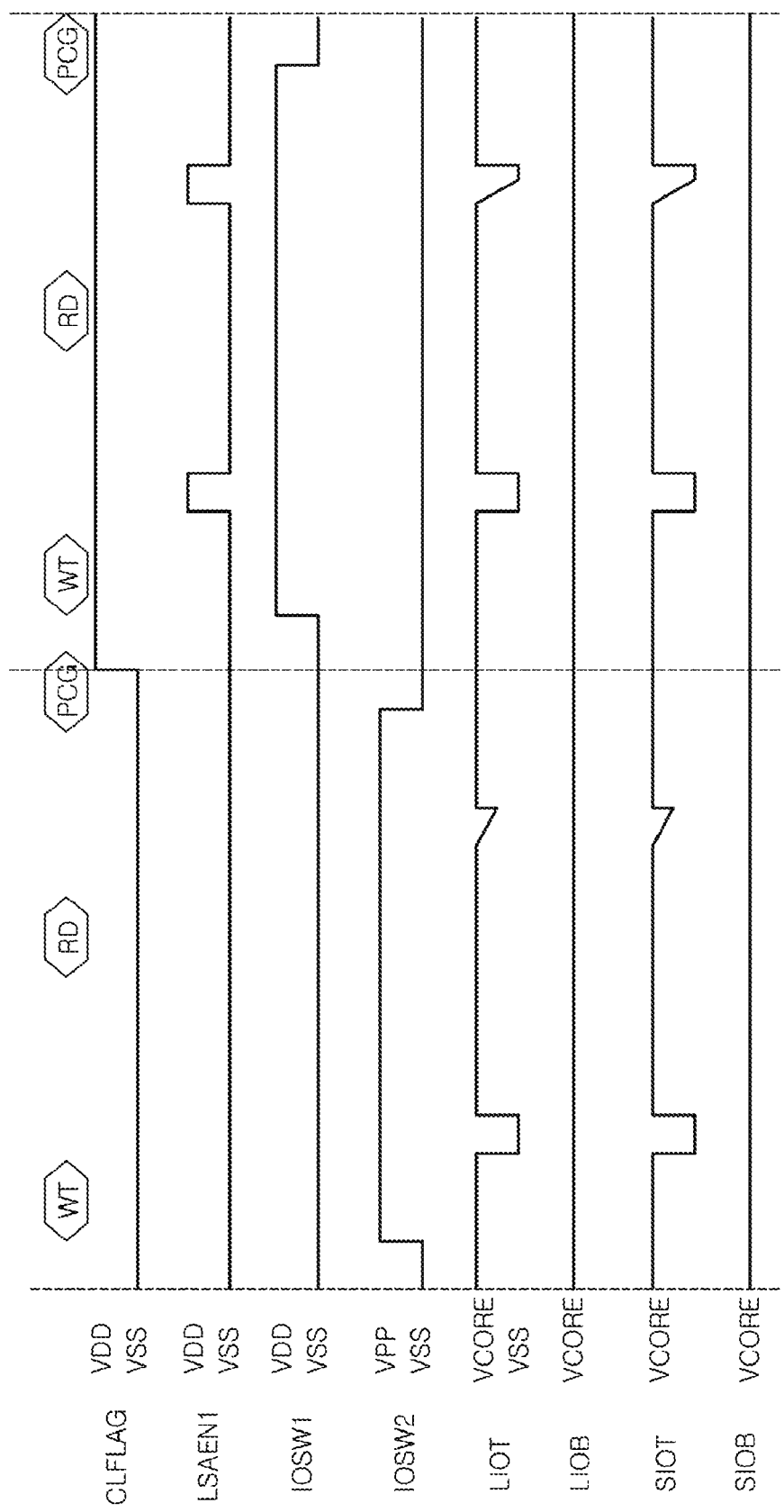

DATA TRANSFER CIRCUIT OF SEMICONDUCTOR APPARATUS

CROSS-REFERENCES TO RELATED APPLICATION

The present application claims priority under 35 U.S.C. §119(a) to Korean Patent Application No. 10-2010-0064303, filed on Jul. 5, 2010, in the Korean Intellectual Property Office, which is incorporated herein by reference in its entirety as if set forth in full.

BACKGROUND

1. Technical Field

The present invention relates to a semiconductor apparatus, and more particularly, to a data transfer circuit which may be used in a semiconductor apparatus.

2. Related Art

FIGS. 1 and 2 are circuit diagrams of exemplary data transfer circuits of a conventional semiconductor apparatus. Specifically, FIG. 1 is a diagram illustrating a data transfer circuit 1 of a semiconductor apparatus using a conventional switch control scheme, which may include a bit line sense amplifier 10, column switches M1 and M2, and input/output switches M3 and M4.

The column switches M1 and M2 may be coupled between bit lines BLT and BLB and first data lines SIOT and SIOB, respectively.

The input/output switches M3 and M4 may be coupled between the first data lines SIOT and SIOB and second data lines LIOT and LIOB, respectively.

The bit line sense amplifier 10 may be coupled to the bit lines BLT and BLB, and may detect and amplify data on the bit lines BLT and BLB, and output the amplified data to the column switches M1 and M2.

The column switches M1 and M2 may couple the bit lines BLT and BLB to the first data lines SIOT and SIOB, respectively, in response to a column selection signal YI.

The input/output switches M3 and M4 may couple the first data lines SIOT and SIOB to the second data lines LIOT and LIOB, respectively, in response to an input/output control signal IOSW.

In this configuration, the loads of the second data lines LIOT and LIOB may be larger than those of the bit lines BLT and BLB and the first data lines SIOT and SIOB.

Data on the first data lines SIOT and SIOB and data on the second data lines LIOT and LIOB may be driven by a core voltage VCORE with a level corresponding to a half of that of a supply voltage VDD.

One method to transfer data with the level of the core voltage VCORE to the second data lines LIOT and LIOB having a relatively large load without loss, is to apply the input/output control signal IOSW with a level which is equal to or higher than the sum of the threshold voltage of NMOS transistors constituting the input/output switches M3 and M4 and the core voltage VCORE.

Accordingly, a boosting voltage VPP obtained by boosting the supply voltage VDD may be used as the input/output control signal IOSW.

According to some aspects of the conventional art as described above, when detecting the data on the second data lines LIOT and LIOB by a charge sharing operation, the voltage difference between the second data lines LIOT and LIOB, or a delta voltage, is required.

One way to quickly ensure the delta voltage, is to quickly drive the column switches M1 and M2, that is, to advance the activation timing of the column selection signal YI.

FIG. 2 is an illustration of a data transfer circuit 2 using a conventional local amplification scheme which further includes a local sense amplifier.

The local sense amplifier 20 may include a plurality of transistors M5 to M9 which are provided between the first data lines SIOT and SIOB.

The local sense amplifier 20 amplifies the data on the first data lines SIOT and SIOB in response to signals such as an enable signal LSAEN and transfers the amplified data to the second data lines LIOT and LIOB.

One problem with the conventional art is that, since the data transfer circuit 1 using the conventional switch control scheme delays tRCD (RAS to CAS delay) of asynchronous parameters, a tRCD margin is reduced.

Furthermore, in the data transfer circuit depicted in FIG. 2 using the conventional local amplification scheme, the data on the data lines LIOT and LIOB has a relatively large level difference according to the amplification operation of the local sense amplifier 20, as compared with the charge sharing scheme of FIG. 1. Therefore, in a subsequent precharge operation, the consumption of a current for returning the data lines LIOT and LIOB to the level of the core voltage VCORE is increased.

SUMMARY

Accordingly, there is a need for an improved data transfer circuit of a semiconductor apparatus that may obviate the above-mentioned problems. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

According to one aspect of the invention, a semiconductor apparatus includes a data transfer unit. The data transfer unit in turn includes: a first data line; a second data line; a first transfer unit configured to amplify data on the first data line in response to a first control signal and transfer amplified data to the second data line; and a second transfer unit configured to electrically connect the first data line to the second data line in response to a second control signal.

According to another aspect of the invention, a data transfer circuit of a semiconductor apparatus includes a first data line coupled to a bit line sense amplifier; a second data line coupled to an input/output sense amplifier; a local sense amplifier configured to amplify data on the first data line in response to an enable signal and transfer amplified data to the second data line; and a plurality of switches configured to electrically connect the first data line to the second data line in response to a switching signal.

BRIEF DESCRIPTION OF THE DRAWINGS

The accompanying drawings, which are incorporated in and constitute a part of this specification, explain various embodiments consistent with the invention and, together with the description, serve to explain the principles of the invention.

FIG. 5 is a diagram illustrating exemplary output waveforms of a data transfer circuit of a semiconductor apparatus according to an exemplary embodiment.

DETAILED DESCRIPTION

Figure 1:
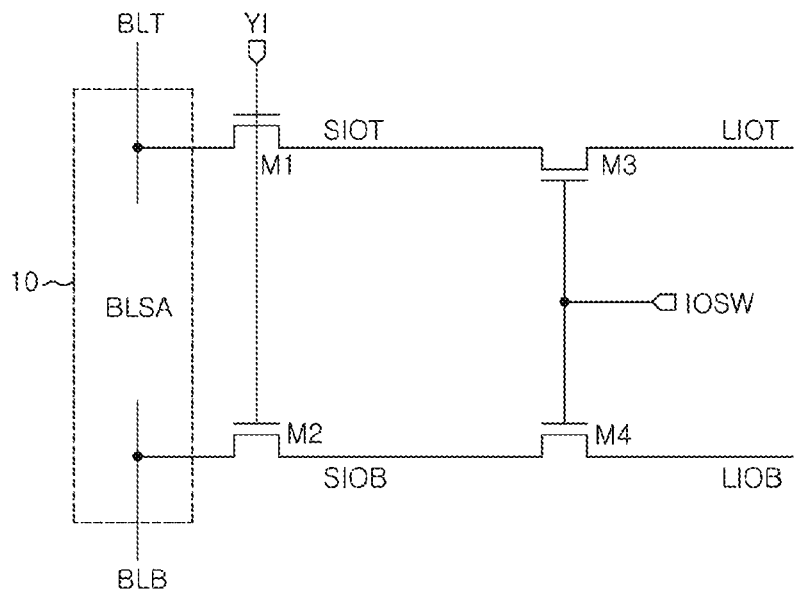
FIGS. 1 and 2 are circuit diagrams of exemplary data transfer circuits of a conventional semiconductor apparatus.
Figure 2:
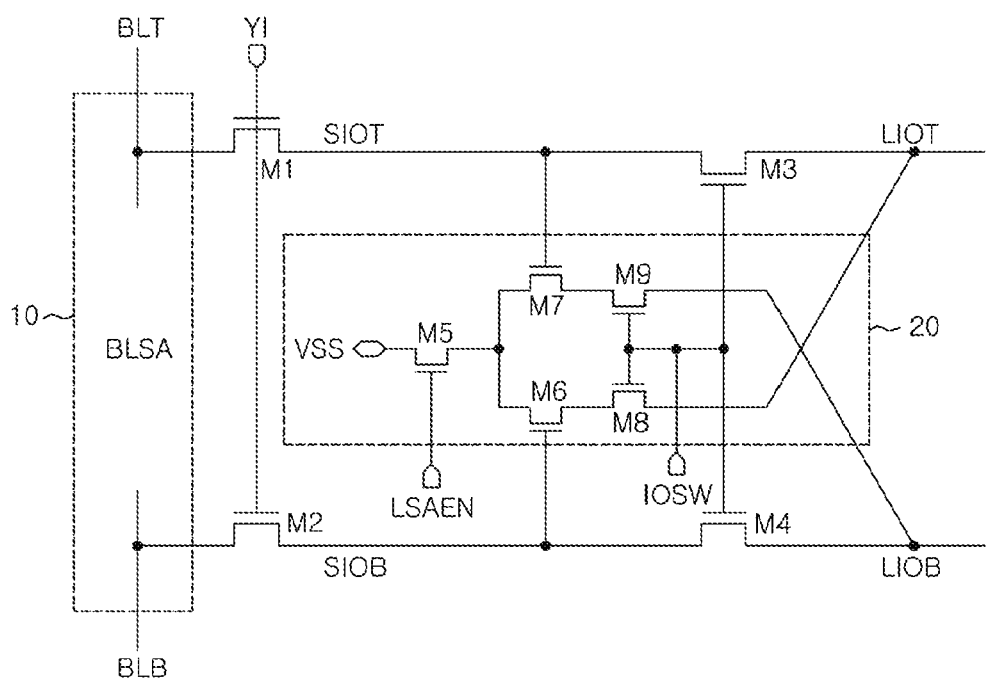

Reference will now be made in detail to the exemplary embodiments consistent with the present disclosure, examples of which are illustrated in the accompanying drawings. Wherever possible, the same reference characters will be used throughout the drawings to refer to the same or like parts.

In one exemplary embodiment, a switch control scheme or a local amplification scheme for coupling different data lines to each other is automatically selected according to the operation conditions of the semiconductor apparatus, for example, an operation speed of the semiconductor apparatus.

By means of example, the local amplification scheme may be used in a high speed operation of the semiconductor apparatus to increase a tRCD margin, the switch control scheme may be used in a low speed operation of the semiconductor apparatus to reduce current consumption, and CAS latency (CL) may be used for a reference for determining the speed of the semiconductor apparatus.

A CAS latency value, which will be described later, is an example of an embodiment, and can be variably applied according to the type and various operation conditions of the semiconductor apparatus.

Figure 3:
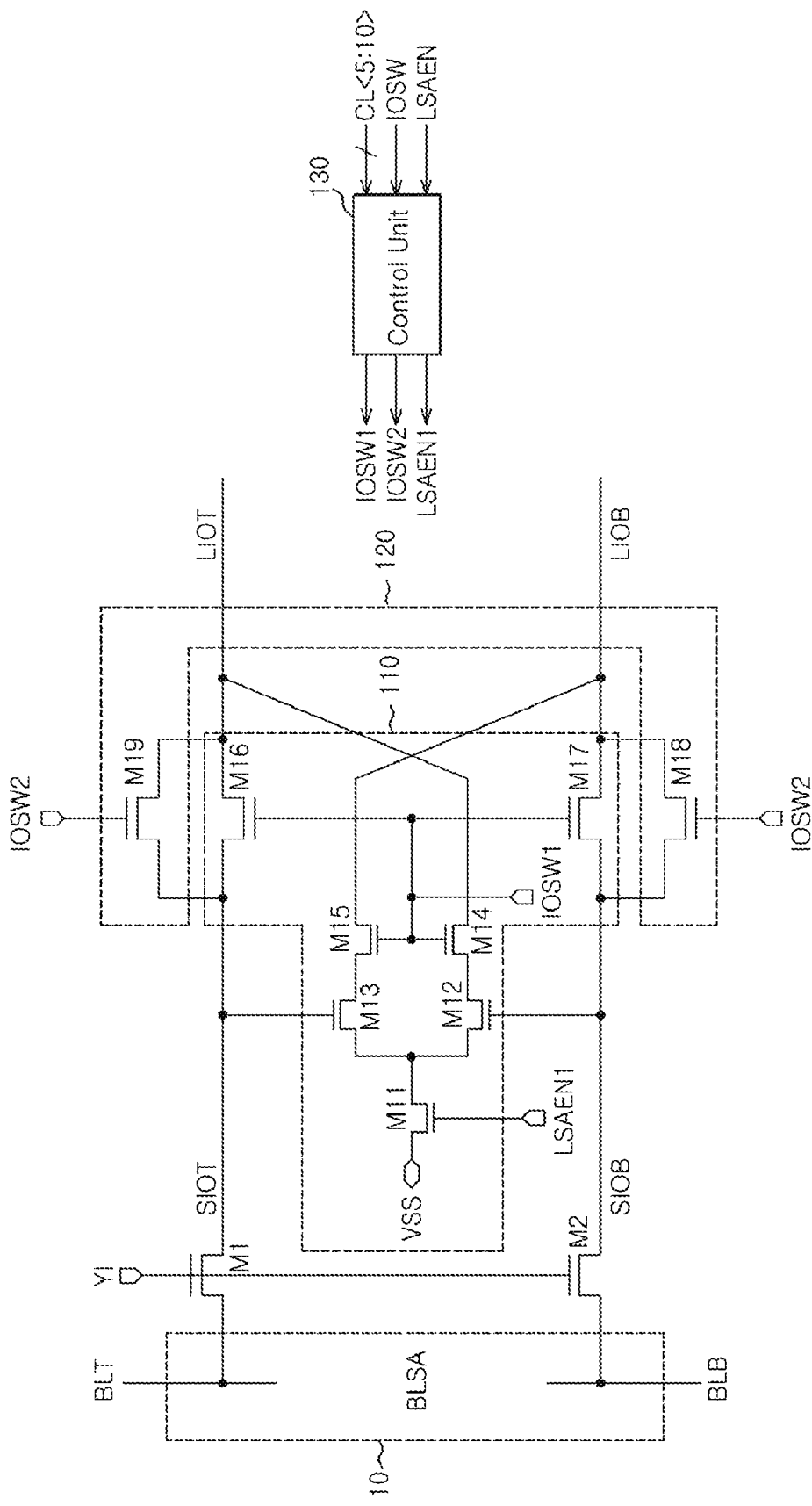
FIG. 3 is a circuit diagram of a data transfer circuit of a semiconductor apparatus according to an exemplary embodiment of the disclosure.

FIG. 3 illustrates one data transfer circuit 100 of a semiconductor apparatus according to an exemplary embodiment of the disclosure, which may include first data lines SIOT and SIOB, second data lines LIOT and LIOB, a first transfer unit 110, a second transfer unit 120, and a control unit 130.

The first data lines SIOT and SIOB may be coupled to bit lines BLT and BLB through column switches M1 and M2, respectively.

A bit line sense amplifier 10 may be coupled to the bit lines BLT and BLB.

The first transfer unit 110 may be configured to detect and amplify the data on the first data lines SIOT and SIOB in response to a first control signal, that is, a first switching signal IOSW1 and an enable signal LSAEN1, and transfer the amplified data to the second data lines LIOT and LIOB.

The first transfer unit 110 may include local sense amplifiers M11 to M15 and a plurality of switches M16 and M17.

The operation of the local sense amplifiers M11 to M15 may be determined based on the enable signal LSAEN1.

The plurality of switches M16 and M17 may be turned on or off in response to the first switching signal IOSW1.

The second transfer unit 120 may be configured to electrically connect the first data lines SIOT and SIOB to the second data lines LIOT and LIOB in response to a second control signal, that is, a second switching signal IOSW2, respectively.

The second transfer unit 120 may include a plurality of switches M18 and M19.

The plurality of switches M18 and M19 may be turned on or off in response to the second switching signal IOSW2.

The control unit 130 may be configured to generate the first switching signal IOSW1, the second switching signal IOSW2 and the enable signal LSAEN1 according to a result obtained by determining the operation speed of the semiconductor apparatus.

The control unit 130 may be configured to determine that the semiconductor apparatus operates at two speeds, for example, a high speed and a low speed, based on CAS latency signals CL<5:10> defining the CAS latency value, and generate the first switching signal IOSW1, the second switching signal IOSW2 and the enable signal LSAEN1 by using source signals according to the determination result.

An input/output control signal IOSW and an enable signal LSAEN may be used as the source signals.

Figure 4:
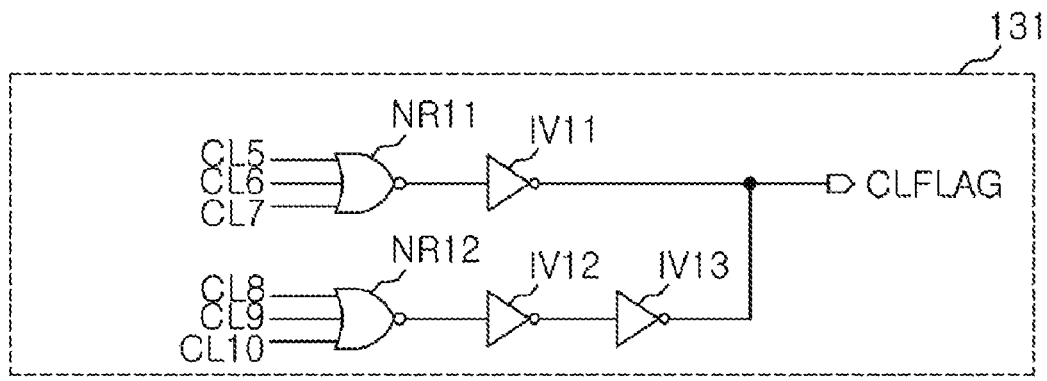
FIG. 4 is a circuit diagram of the control unit illustrated in FIG. 3.
Figure 4:
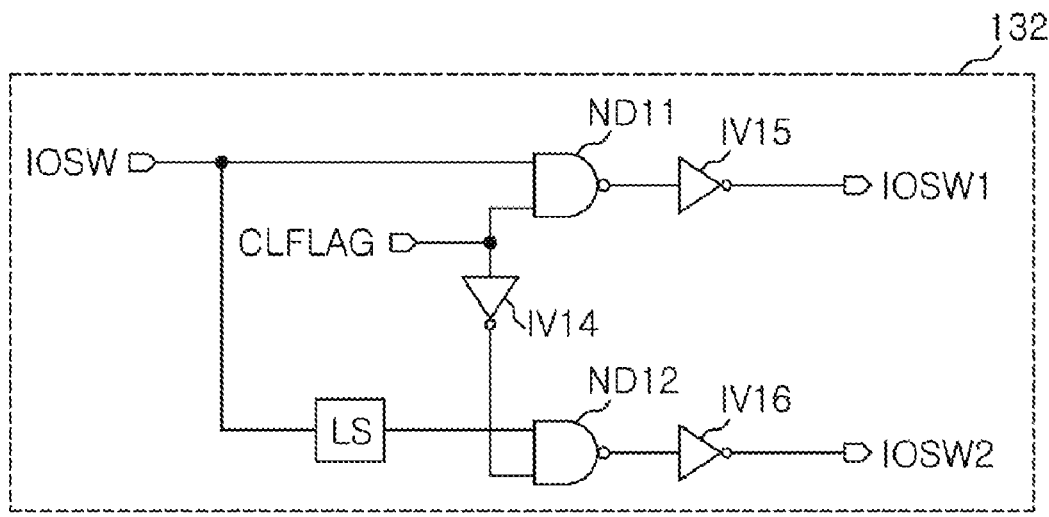
Figure 4:
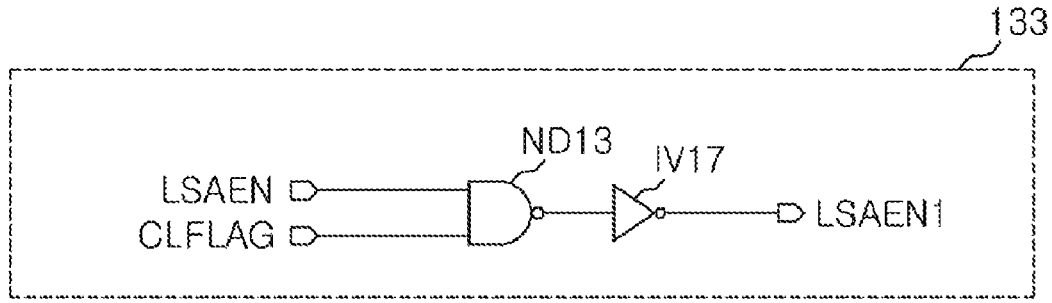

FIG. 4 is an illustration of a control unit 130, which includes first to third signal generation sections 131 to 133.

The first signal generation section 131 may be configured to generate a flag signal CLFLAG by combining the CAS latency signals CL<5:10> with one another.

The first signal generation section 131 may be configured to output the flag signal CLFLAG at a level (for example, a high level) defining the high speed operation of the semiconductor apparatus when CL is 5 to 7.

The first signal generation section 131 may be configured to output the flag signal CLFLAG at a level (for example, a low level) defining the low speed operation of the semiconductor apparatus when CL is 8 to 10.

The first signal generation section 131 may include a plurality of NOR gates NR11 and NR12 and a plurality of inverters IV11 to IV13.

The second signal generation section 132 may be configured to generate the first switching signal IOSW1 or the second switching signal IOSW2 by using the source signal IOSW in response to the flag signal CLFLAG.

The second signal generation section 132 may be configured to generate the first switching signal IOSW1 by using the source signal IOSW when the flag signal CLFLAG is at a high level.

The second switching signal IOSW2 may be substantially maintained at a deactivation level by the flag signal CLFLAG at the high level.

The second signal generation section 132 may be configured to generate the second switching signal IOSW2 by using the source signal IOSW when the flag signal CLFLAG is at a low level.

The first switching signal IOSW1 may be substantially maintained at a deactivation level by the flag signal CLFLAG at the low level.

The second signal generation section 132 may include a level shifter LS, a plurality of NAND gates ND11 and ND12, and a plurality of inverters IV14 to IV16.

Stable operation of the second transfer unit 120 using the switch control scheme may be obtained using the second switching signal IOSW2 with the level of a boosting voltage VPP on account of to the load difference between the first data lines SIOT and SIOB and the second data lines LIOT and LIOB. Further, for the operation of the first transfer unit 110, the first switching signal IOSW1 with the level of a supply voltage VDD may be used.

The level shifter LS may be coupled to a signal path for generating the second switching signal IOSW2.

The third signal generation section 133 may be configured to generate the enable signal LSAEN1 by using the source signal LSAEN in response to the flag signal CLFLAG.

The third signal generation section 133 may be configured to generate the enable signal LSAEN1 by using the source signal LSAEN when the flag signal CLFLAG is at the high level.

The third signal generation section 133 may be configured to allow the enable signal LSAEN1 to be substantially maintained at a deactivation level when the flag signal CLFLAG is at the low level.

The operation of the data transfer circuit 100 having the is above configuration according to the embodiment of the invention will be described with reference to FIGS. 3 to 5 below.

When the embodiment at a low speed, such as for example CL=8 to 10, the flag signal CLFLAG at the low level is outputted.

The second switching signal IOSW2 may be generated in response to the flag signal CLFLAG at a low level.

Meanwhile, the first switching signal IOSW1 and the enable signal LSAEN1 are substantially maintained at a low level.

At this time, the first switching signal IOSW1 and the second switching signal IOSW2 are generated using the source signal IOSW. The source signal IOSW may be activated in response to an active command and deactivated in response to a precharge command PCG.

The plurality of switches M18 and M19 of the second transfer unit 120 may be turned on in response to the second switching signal IOSW2 with the level of the boosting voltage VPP.

The first data lines SIOT and SIOB may be coupled to the second data lines LIOT and LIOB by the plurality of switches M18 and M19 turned on, respectively.

In the case of a read operation, data on the bit lines BLT and BLB may be amplified through a bit line sense amplifier BLSA and transferred to an input/output sense amplifier IOSA (not shown) via the column switches M1 and M2, the first data lines SIOT and SIOB and the second data lines LIOT and LIOB.

Meanwhile, in the case of a write operation, data driven on the second data lines LIOT and LIOB by a write driver (not shown) may be transferred to the bit line sense amplifier BLSA via the first data lines SIOT and SIOB and the column switches M1 and M2.

As described above, when the semiconductor apparatus operates at the low speed, data may be transferred using the switch control scheme through the transfer unit 120.

In the low speed operation of an exemplary embodiment of the semiconductor apparatus, a tRCD margin may be relatively sufficient as compared with a high speed operation of the semiconductor apparatus. Consequently, when the exemplary semiconductor apparatus operates at the low speed, data may be transferred through the second transfer unit 120 using the switch control scheme in which current consumption is relatively low, which may result in the reduction in current consumption.

Meanwhile, when the exemplary semiconductor apparatus operates at a high speed, such as for example CL=5 to 7, the flag signal CLFLAG at the high level may be outputted.

The first switching signal IOSW1 and the enable signal LSAEN1 may be generated in response to the flag signal CLFLAG at the high level.

At this time, the second switching signal IOSW2 may be substantially maintained at a low level.

The plurality of switches M16 and M17 and the transistors M14 and M15 constituting the local sense amplifiers of the first transfer unit 110 may be turned on in response to the first switching signal IOSW1 with the level of the supply voltage VDD.

Furthermore, the transistor M11 may be turned on in response to the enable signal LSAEN1.

In the case of a read operation, data on the bit lines BLT and BLB may be amplified through a bit line sense amplifier BLSA and transferred to the first data lines SIOT and SIOB through the column switches M1 and M2.

The local sense amplifiers M11 to M15 detect and amplify the data on the first data lines SIOT and SIOB and transfer the amplified data to the second data lines LIOT and LIOB.

The data on the second data lines LIOT and LIOB may be transferred to the input/output sense amplifier.

Meanwhile, in the case of a write operation, data driven on the second data lines LIOT and LIOB by the write driver (not shown) is transferred to the bit line sense amplifier BLSA via the first data lines SIOT and SIOB and the column switches M1 and M2.

As described above, when the semiconductor apparatus operates at a high speed, data can be transferred using the local amplification scheme through the transfer unit 110.

In high speed operation of a semiconductor apparatus, the tRCD margin may be insufficient as compared with the low speed operation of a semiconductor apparatus. Thus, the first transfer unit 110 employing the local amplification scheme capable of quickly ensuring the voltage difference (that is, a delta voltage) between the second data lines LIOT and LIOB as compared with the switch control scheme can be used. Consequently, since the delta voltage is quickly ensured, that is, a data transfer speed is fast, it is not necessary to advance the activation timing of a column selection signal YI, so that the tRCD margin is increased.

As a result, according to one embodiment, it may be possible to reduce the current consumption and increase the tRCD margin in the state where data transfer performance is stably maintained when the semiconductor apparatus operates at the low speed operation and the high speed operation.

According to one embodiment, a switch control scheme and a local amplification scheme are automatically switched based on the operation conditions of a semiconductor apparatus, so that a tRCD margin can be increased and current consumption can be reduced, resulting in the improvement of the performance of the semiconductor apparatus.

While certain embodiments have been described above, it will be understood to those skilled in the art that the embodiments described are by way of example only. Accordingly, the data transfer circuit of the semiconductor apparatus described herein should not be limited based on the described embodiments. Rather, the data transfer circuit of the semiconductor apparatus described herein should only be limited in light of the claims that follow when taken in conjunction with the above description and accompanying drawings.

What is claimed is:

1. A semiconductor apparatus including a data transfer unit, the data transfer unit comprising:
 a first data line;
 a second data line;
 a first transfer unit configured to amplify data on the first data line in response to a first control signal, and transfer amplified data to the second data line; and
 a second transfer unit configured to connect the first data line to the second data line in response to a second control signal.

2. The semiconductor apparatus according to claim 1, the data transfer unit further comprises a control unit configured to generate the first control signal and the second control signal according to a result obtained by determining an operation speed of the semiconductor apparatus.

3. The semiconductor apparatus according to claim 2, wherein the control unit is configured to determine the operation speed of the semiconductor apparatus based on CAS latency signals.

4. The semiconductor apparatus according to claim 2, wherein the control unit is configured to determine that the semiconductor apparatus operates at two speeds based on CAS latency signals, and selectively activate the first control signal and the second control signal according to a determination result.

5. The semiconductor apparatus according to claim 2, wherein the control unit is configured to determine that the semiconductor apparatus operates at a high speed and a low speed based on CAS latency signals, and activate the first control signal when it is determined that the semiconductor apparatus operates at the high speed and activating the second control signal when it is determined that the semiconductor apparatus operates at the low speed.

6. A data transfer circuit of a semiconductor apparatus, comprising:
   a first data line coupled to a bit line sense amplifier;
   a second data line coupled to an input/output sense amplifier;
   a local sense amplifier configured to amplify data on the first data line in response to an enable signal, and transfer amplified data to the second data line; and
   a plurality of switches configured to connect the first data line to the second data line in response to a switching signal.

7. The data transfer circuit of the semiconductor apparatus according to claim 6, further comprising a control unit configured to generate the enable signal and the switching signal according to a result obtained by determining an operation speed of the semiconductor apparatus.

8. The data transfer circuit of the semiconductor apparatus according to claim 7, wherein the control unit is configured to determine that the semiconductor apparatus operates at a high speed and a low speed based on CAS latency signals, and activate the enable signal when it is determined that the semiconductor apparatus operates at the high speed while activating the switching signal when it is determined that the semiconductor apparatus operates at the low speed.

9. The data transfer circuit of the semiconductor apparatus according to claim 7, wherein the control unit comprises;
   a first signal generation section configured to generate a flag signal by combining CAS latency signals, which define two or more CAS latency values; and
   a second signal generation section configured to generate the switching signal in response to the flag signal; and
   a third signal generation section configured to generate the enable signal in response to the flag signal.

10. The data transfer circuit of the semiconductor apparatus according to claim 9, wherein the first signal generation section is configured to output the flag signal at a level defining a high speed operation of the semiconductor apparatus when the CAS latency values defined by the CAS latency signals are equal to or less than a set value.

11. The data transfer circuit of the semiconductor apparatus according to claim 9, wherein the first signal generation section is configured to output the flag signal at a level defining a low speed operation of the semiconductor apparatus when the CAS latency values defined by the CAS latency signals exceed a set value.

12. The data transfer circuit of the semiconductor apparatus according to claim 9, wherein the second signal generation section is configured to generate the switching signal by using power with a level different from a level of power for generating the enable signal.

\* \* \* \* \*